United States Patent
Chang et al.

(10) Patent No.: US 8,331,890 B2
(45) Date of Patent: Dec. 11, 2012

(54) DUTY-TO-VOLTAGE AMPLIFIER, FM RECEIVER AND METHOD FOR AMPLIFYING A PEAK OF A MULTIPLEXED SIGNAL

(75) Inventors: Hsiang-Hui Chang, Taipei County (TW); Chieh Hung Chen, Kaohsiung (TW)

(73) Assignee: MediaTek Inc., Hsinchu (TW)

( * ) Notice: Subject to any disclaimer, the term of this patent is extended or adjusted under 35 U.S.C. 154(b) by 719 days.

(21) Appl. No.: 12/372,403

(22) Filed: Feb. 17, 2009

(65) Prior Publication Data
US 2009/0156146 A1 Jun. 18, 2009

Related U.S. Application Data (62) Division of application No. 11/403,740, filed on Apr. 13, 2006, now Pat. No. 7,697,908.

(51) Int. Cl.
*H04B 1/16* (2006.01)
(52) U.S. Cl. ............ 455/217; 455/205; 455/226.3; 455/334; 330/252
(58) Field of Classification Search ............ 455/205, 455/217, 226.1–226.3, 334, 341; 330/252
See application file for complete search history.

(56) References Cited

U.S. PATENT DOCUMENTS

| 4,300,019 | A | 11/1981 | Toyomaki |
| 6,236,844 | B1 * | 5/2001 | Cvetkovic et al. ............ 455/273 |
| 6,262,628 | B1 | 7/2001 | Shinomiya |
| 7,787,630 | B2 * | 8/2010 | Lerner et al. ............ 381/2 |
| 2006/0097850 | A1 * | 5/2006 | Stobbe et al. ............ 340/10.6 |
| 2007/0243840 | A1 | 10/2007 | Chang et al. |

OTHER PUBLICATIONS

Fig. 1 (prior art), prior to Feb. 17, 2009.
Fig. 2 (prior art), prior to Feb. 17, 2009.

* cited by examiner

*Primary Examiner* — Nhan Le
(74) *Attorney, Agent, or Firm* — Patterson Thuente Christensen Pedersen, P.A.

(57) ABSTRACT

A FM receiver comprises an IF filter, a demodulator and a decoder. The IF filter generates an RSSI and a FM modulated signal in response to a FM signal. The demodulator comprises a duty-to-voltage amplifier for amplifying a peak of a MPX signal. The duty-to-voltage amplifier comprises a current source, a switch and a current splitter. The current source generates a current. The switch controls a flow of the first current in response to a PWM signal. The current splitter splits the flow of the current into a sub-flow in response to the RSSI. The peak of the MPX signal is proportional to the sub-flow. The decoder receives the MPX signal to generate an audio signal to play sound.

15 Claims, 11 Drawing Sheets

DUTY-TO-VOLTAGE AMPLIFIER, FM RECEIVER AND METHOD FOR AMPLIFYING A PEAK OF A MULTIPLEXED SIGNAL

CROSS-REFERENCES TO RELATED APPLICATIONS

This application is a Division of application Ser. No. 11/403,740, filed Apr. 30, 2006, the disclosures of which are hereby incorporated by reference in their entirety.

BACKGROUND OF THE INVENTION

1. Field of the Invention

The present invention relates to a duty-to-voltage amplifier, a FM receiver and a method for amplifying a peak of a MPX signal; more specifically, relates to a duty-to-voltage amplifier, a FM receiver and a method for amplifying a peak of a MPX signal via a current splitter.

2. Descriptions of the Related Art

Figure 1:
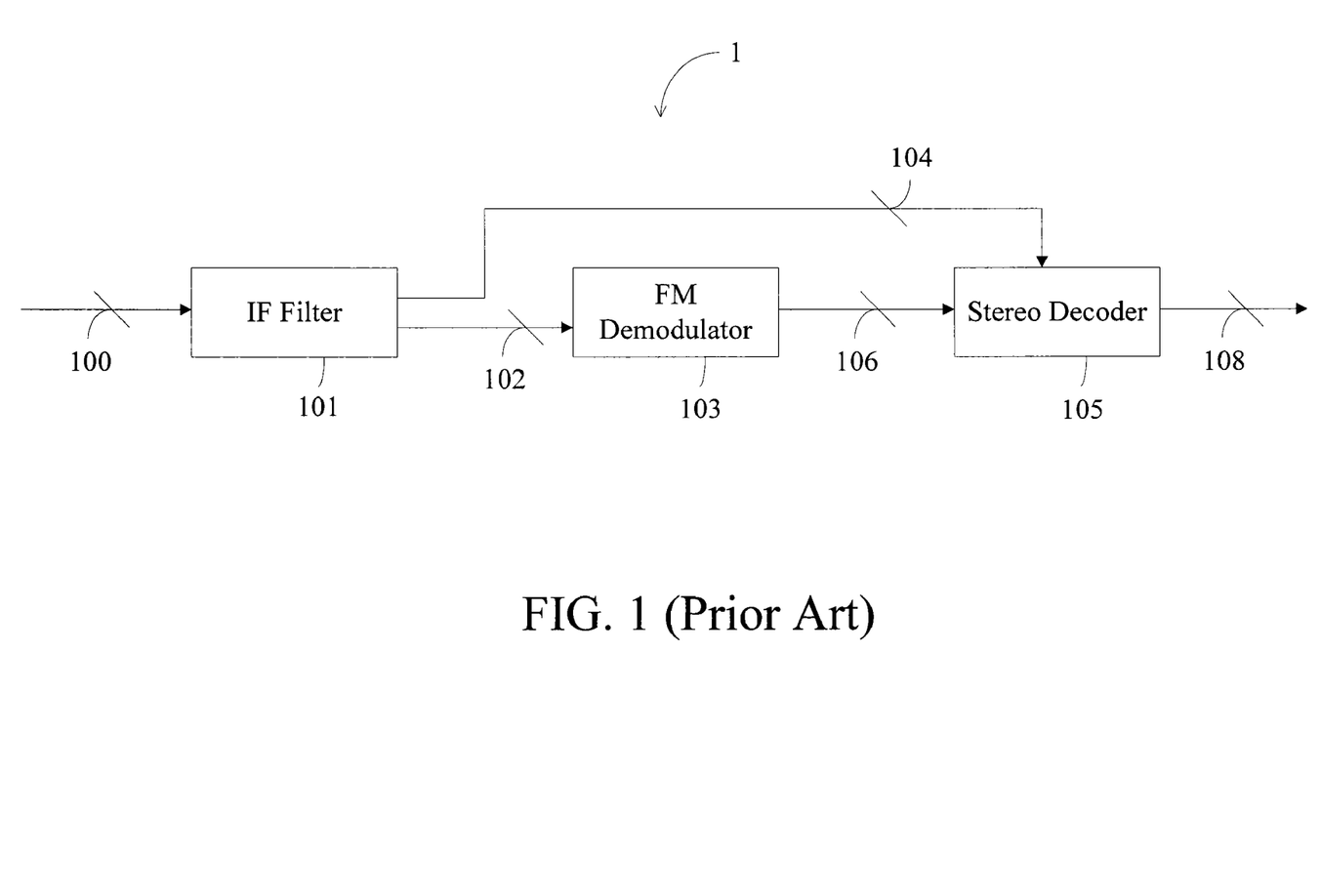
FIG. 1 is a block diagram of a FM receiver of the prior art.

Frequency modulation (FM) is frequently used for the purpose of wireless communications. To receive FM signals successfully, a particular receiver is required. As shown in FIG. 1, a FM receiver 1 of the prior art comprises an intermediate frequency (IF) filter 101, a FM demodulator 103 and a stereo decoder 105. The IF filter 101 filters a FM signal 100 which is derived from a radio frequency filter (not shown) filtering an RF signal, and generates a FM modulated signal 102 and a relative signal strength indicator (RSSI) 104. The FM demodulator 103 generates a MPX signal 106 by demodulating the FM modulated signal 102. The MPX signal 106 comprises a pilot signal and an audio signal which is either stereo or mono. The stereo decoder 105 retrieves the audio signal 108 by decoding the MPX signal 106 in an appropriate decoding process according to the pilot signal. The audio signal 108 is then transmitted to a loudspeaker to play sound.

Figure 2:
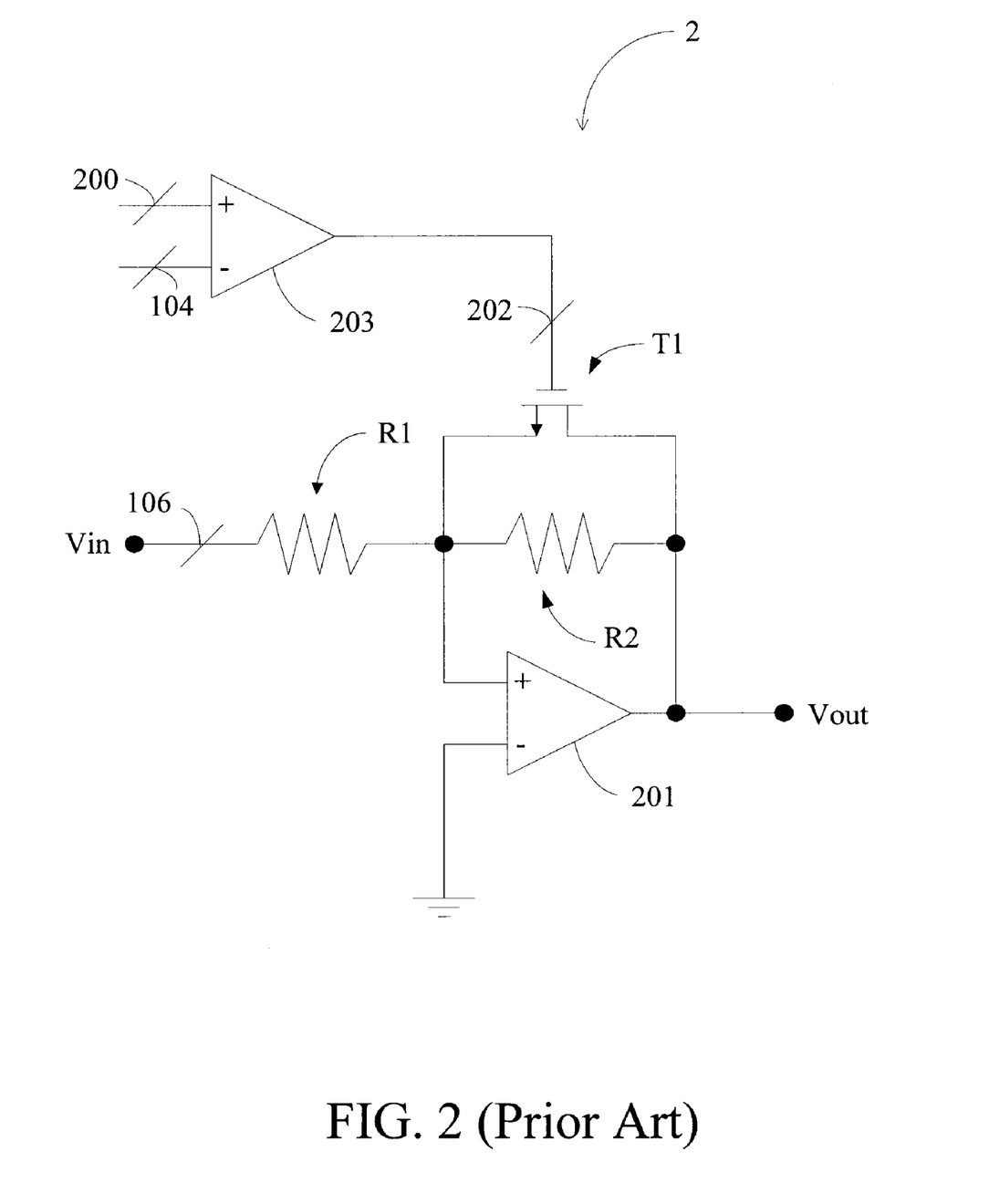
FIG. 2 is a block diagram of an amplifying circuit of the FM receiver of the prior art.

The RSSI 104 is used to indicate the strength of the RF signal. When RSSI 104 indicates that the RF signal is too weak to be processed, the FM receiver 1 trigger a soft-mute operation in which the MPX signal 106 is adjusted smaller and smaller until sound disappears. The stereo decoder 105 comprises an amplifying circuit 2, as FIG. 2 shows, that may perform the soft-mute operation in response to the RSSI 104. The amplifying circuit 2 comprises two resistors R1 and R2, a transistor T1, an operational amplifier 201, and a compared amplifier 203. The compared amplifier 203 compares a reference signal 200 and the RSSI 104 to generate a compared signal 202. The compared signal 202 is inputted to the gate of the transistor T1 so the resistance RT between the source and the drain may be controlled by the compared signal 202. The transform equation, i.e. the gain, of the amplifying circuit 2 is shown as followed:

$$\frac{Vout}{Vin} = -\frac{R2 \,/\!/\, RT}{R1}$$

$$RT = \frac{1}{\mu_n C_{ox} \frac{W}{L}(RSSI' - Vout - Vt)}$$

wherein $$\mu_n C_{ox} \frac{W}{L}$$

denotes a physical parameter of the transistor T1, Vt denotes a threshold voltage of the transistor T1, and RSSI' denotes the voltage of the compared signal 202. When a soft-mute operation is triggered, the resistance RT is much smaller than R2. The transform equation may therefore be re-written as:

$$\frac{Vout}{Vin} \approx -\frac{1}{R1} \cdot \frac{1}{\mu_n C_{ox} \frac{W}{L}(RSSI' - Vout - Vt)}$$

Since the MPX signal 106 is inputted to the Vin end, the peak of the MPX signal 106, outputted from the Vout end, can be reduced in response to the voltage of the compared signal 202.

However, such arrangement causes that the gain is influenced by the peak of the MPX signal 106, and hence makes distortion serious. Accordingly, a solution to solve the problem of distortion when a soft-mute operation is triggered is desired in the industrial field.

SUMMARY OF THE INVENTION

One object of this invention is to provide a duty-to-voltage amplifier for amplifying a peak of a MPX signal. The duty-to-voltage amplifier comprises a current source, a switch and a current splitter. The current source generates a current. The switch controls a flow of the current in response to a PWM signal. The current splitter splits the flow of the current into a sub-flow in response to an RSSI. The peak is proportional to the sub-flow.

Another object of this invention is to provide a method for amplifying a peak of a MPX signal. The method comprises the following steps: generating a current; providing a switch to control a flow of the current in response to a PWM signal; and splitting the flow of the current into a sub-flow in response to an RSSI. The peak is proportional to the sub-flow.

Another object of this invention is to provide a FM receiver. The FM receiver comprises an IF filter, a demodulator and a decoder. The IF filter generates an RSSI and a FM modulated signal in response to a FM signal. The demodulator generates a MPX signal in response to the FM modulated signal and amplifies a peak of the MPX signal in response to the RSSI. The decoder receives the MPX signal and generates an audio signal in response to the peak.

Another object of this invention is to provide a duty-to-voltage amplifier for amplifying a peak of a MPX signal. The duty-to-voltage amplifier comprises means for generating a current; means for controlling a flow of the current in response to a PWM signal; and means for splitting the flow of the current into a sub-flow in response to an RSSI. The peak is proportional to the sub-flow.

The present invention is capable of decreasing distortion in order to decrease noise, when a soft-mute operation is triggered, by splitting a current to determine the peak of a MPX signal in response to an RSSI.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 3:
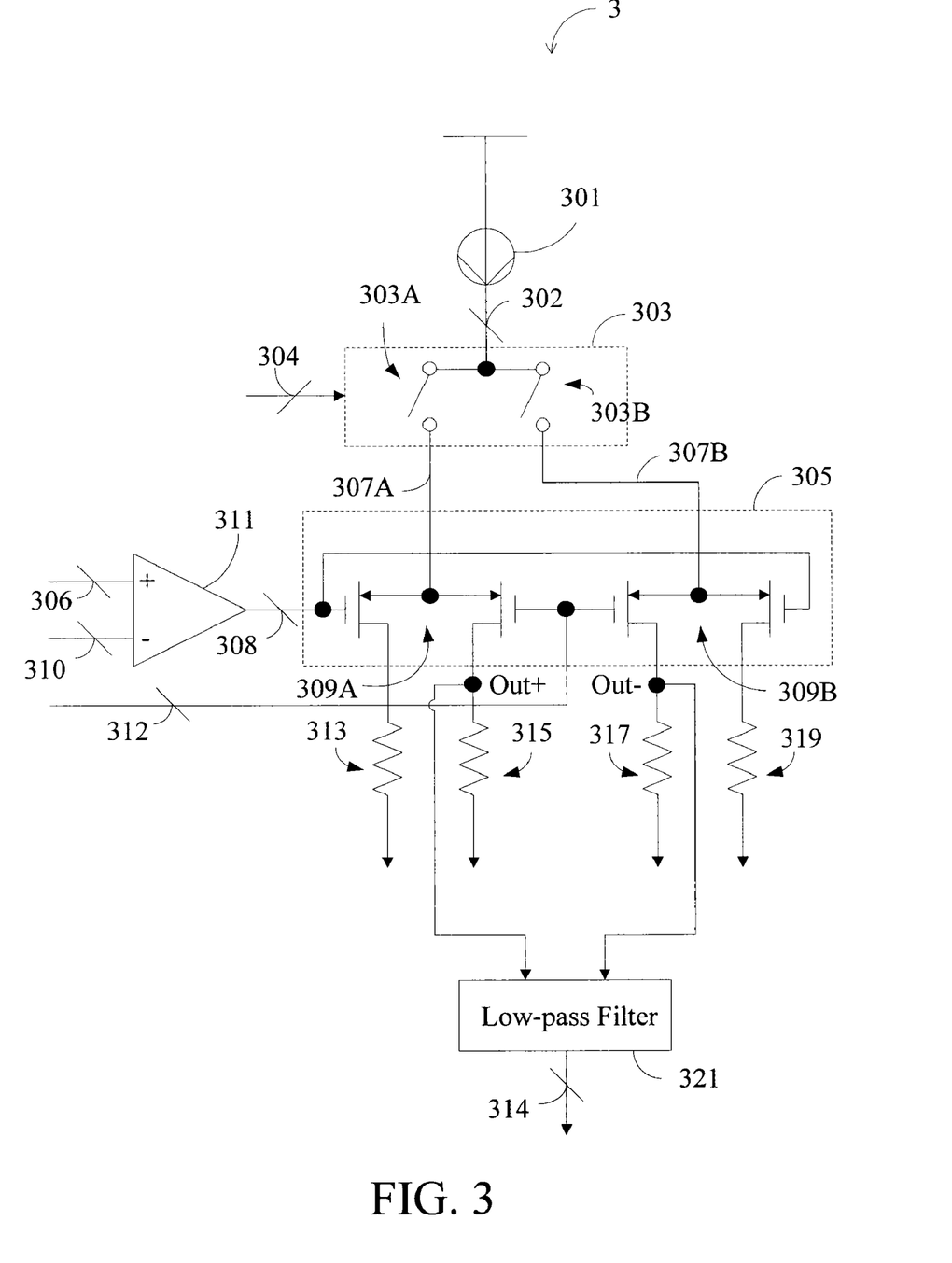
FIG. 3 is a block diagram of a first embodiment of the present invention.

A first embodiment of the present invention is a duty-to-voltage amplifier for amplifying a peak of a MPX signal in response to an RSSI. The duty-to-voltage amplifier is embedded in a FM demodulator. As shown in FIG. 3, the duty-to-voltage amplifier 3 comprises a current source 301, a switch 303 and a current splitter 305. The current source 301 is configured to generate a current 302. The switch 303, comprising a pair of complementary switches 303A and 303B, is configured to control a flow of the current 302 in response to a PWM signal 304. More particularly, the operations of the switches 303A and 303B are complementary in response to the PWM signal 304. For example, if the PWM signal 304 is high, the switch 303A is ON and the switch 303B is OFF. The current 302 flows through a path 307A. Otherwise, the switch 303A is OFF and the switch 303B is ON when the PWM signal 304 is low. The current 302 flows through a path 307B. Accordingly, the switch 303 controls the current 302 to flow through either the path 307A or the path 307B.

Figure 4:
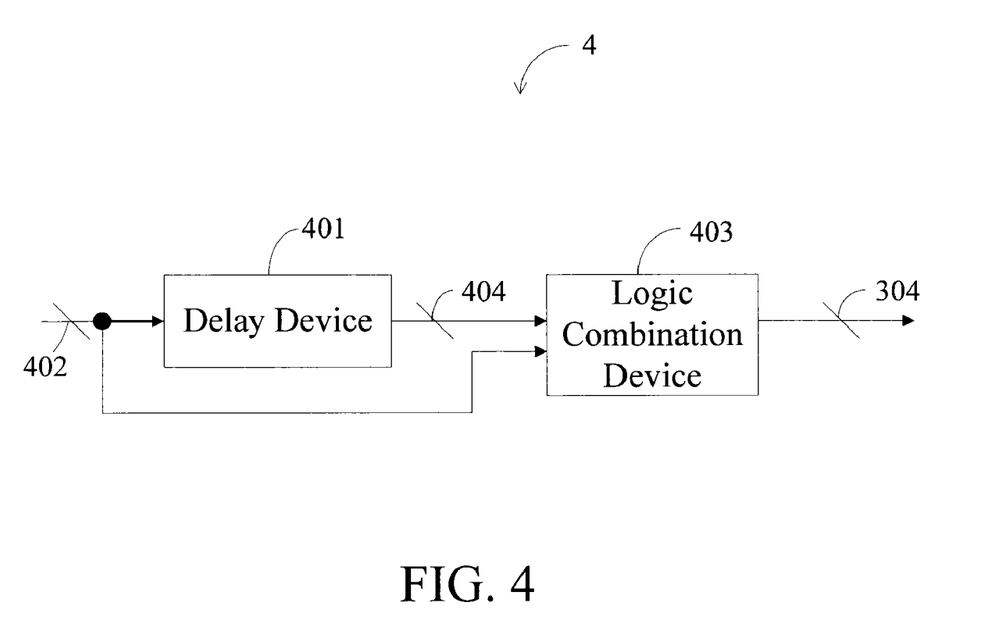
FIG. 4 is a block diagram of a delay circuit of the first embodiment.
Figure 5:
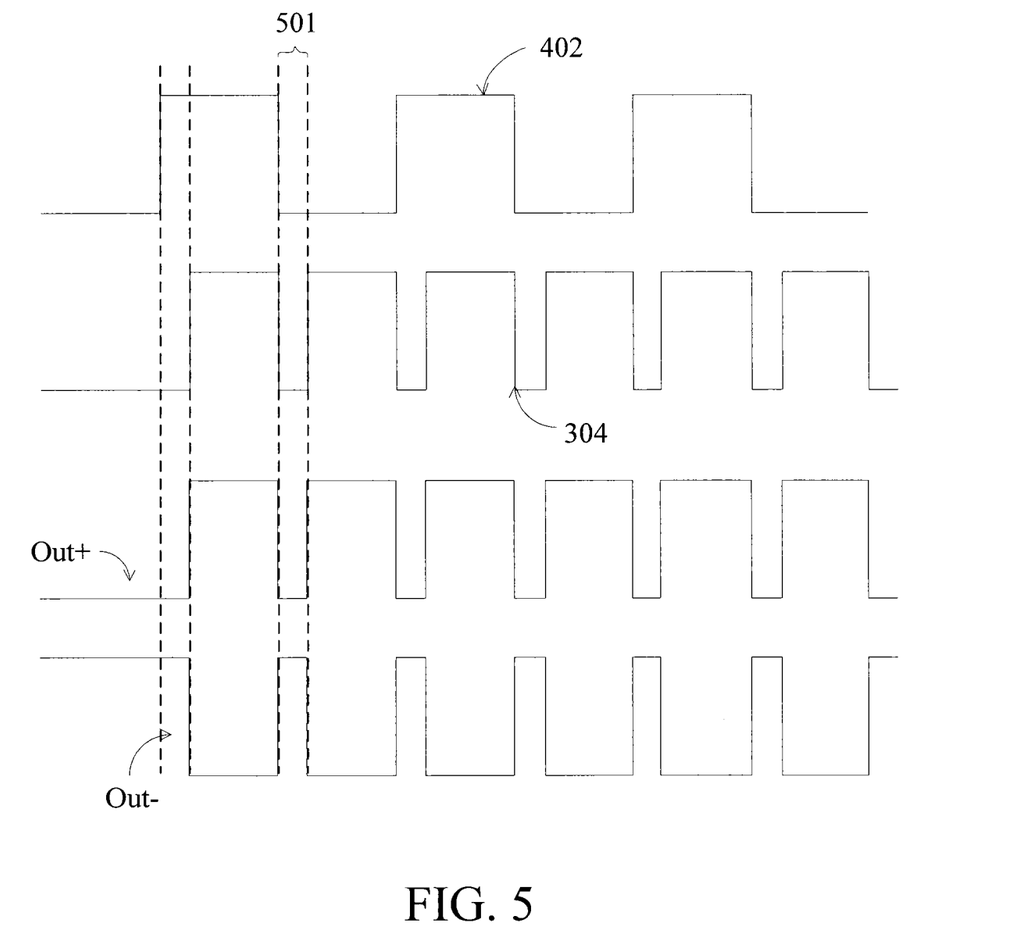
FIG. 5 is some waveforms for illustrating operations of the first embodiment.

FIG. 4 shows how to derive the PWM signal 304. As FIG. 4 shows, the duty-to-voltage amplifier 3 further comprises a delay circuit 4. The delay circuit 4 comprises a delay device 401 and a logic combination device 403. The delay device 401 is configured to delay a FM modulated signal 402 which comes from a previous stage of the FM demodulator, i.e., an IF filter to generate a delayed signal 404. The logic combination device 403 is configured to logically combine the delayed signal 404 and the FM modulated signal 402 to generate the PWM signal 304. FIG. 5 shows an example of the waveforms of the FM modulated signal 402 and the PWM signal 304, wherein an interval 501 is a delayed period of time generated by the delay device 401. In this embodiment, the PWM signal 304 is transmitted to the switch 303A and the complement of the PWM signal 304 is transmitted to the switch 303B.

Referring back to FIG. 3, the current splitter 305 comprises two differential amplifiers 309A and 309B to split the flow of the current 302 into a sub-flow in response to an RSSI 306. The sub-flow refers to a summation of currents flowing passing through nodes Out+ and Out−. The duty-to-voltage amplifier 3 further comprises an amplifier 311 and four loads 313, 315, 317, and 319. The amplifier 311 outputs a differential signal 308 by comparing the RSSI 306 with a threshold voltage 310, wherein the threshold voltage 310 is predetermined. The loads 313, 315, 317, and 319 are configured to generate the sub-flow. The current splitter 305 splits the flow of the current 302 in response to the differential signal 308 as well as a reference signal 312 which is also predetermined. The threshold voltage 310 and the reference signal 312 are set based on practical situations. For example, a MPX signal is required to decay 20 dB when a difference of the RSSI 306 and the threshold voltage 310 reaches 100 mV, or a MPX signal cannot decay when the RSSI 306 is at least 200 mV larger than the threshold voltage 310. The duty-to-voltage amplifier 3 further comprises a low-pass filter 321. The sub-flow flowing through the nodes Out+ and Out− goes to the low-pass filter 321 to generate a MPX signal 314.

When the strength of a received RF signal is strong, the RSSI 306 is larger than the threshold voltage 310. The differential signal 308 is higher than the reference signal 312. The amount of the sub-flow equals to the amount of the current 302. Therefore, the peak of the MPX signal 314 is not adjusted. When the strength of a received RF signal is weak, the RSSI 306 turns smaller than the threshold voltage 310. The differential signal 308 is now lower than the reference signal 312. Some part of the current 302 flows through the loads 313 and 319 so that the amount of the sub-flow is less than the amount of the current 302. Therefore, the peak of the MPX signal 314 is decreased. Furthermore, if the strength of a received RF signal continues decaying, the differential signal 308 will be much lower than the reference signal 312. Almost the whole part of the current 302 flows through the loads 313 and 319. The amount of the sub-flow becomes zero. The MPX signal 314 is muted thereby. The soft-mute operation is complete. The voltage waveforms at nodes Out+ and Out− are also shown in FIG. 5.

Figure 6:
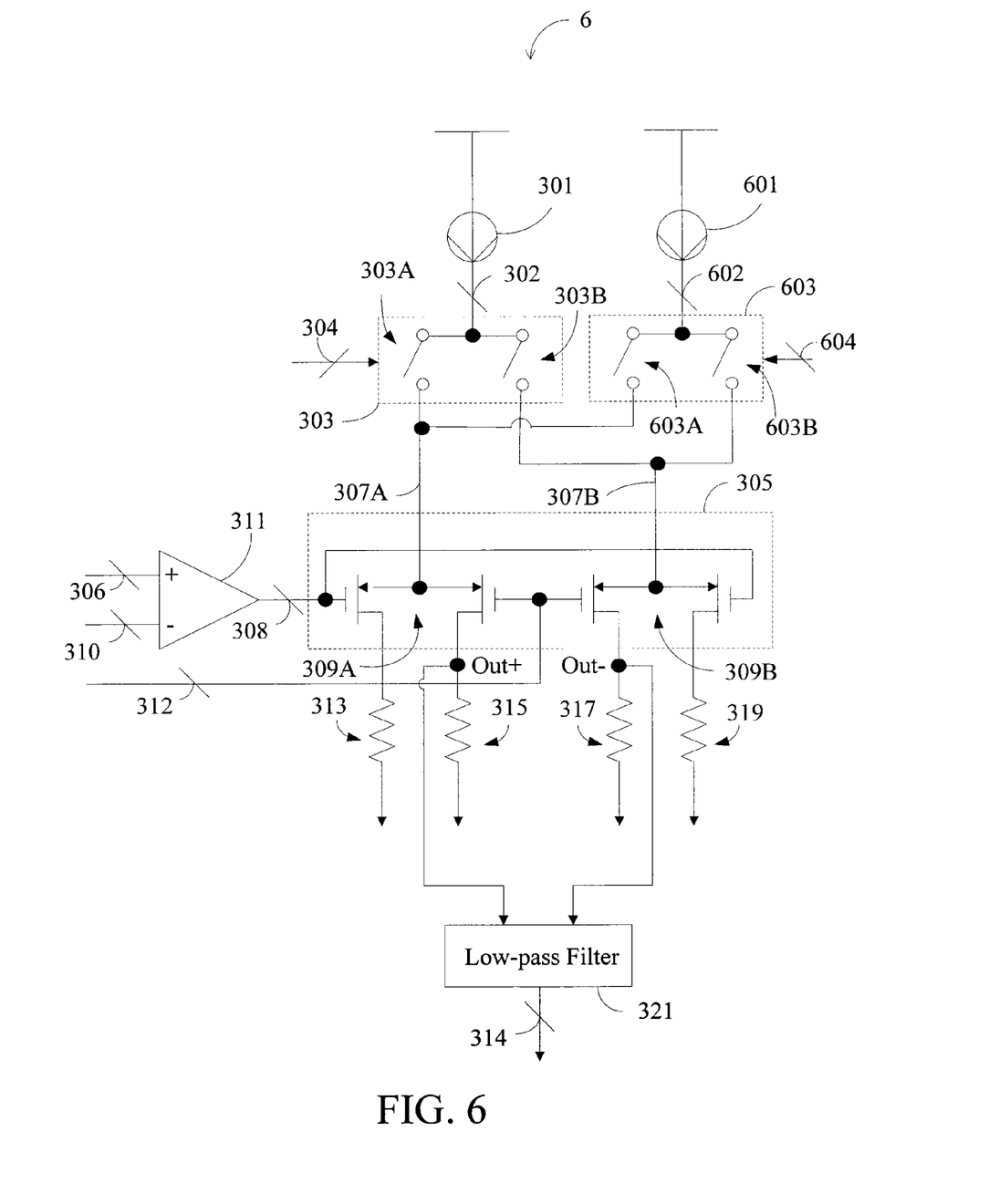
FIG. 6 is a block diagram of a second embodiment of the present invention.

A second embodiment of the present invention is a duty-to-voltage amplifier 6 as shown in FIG. 6. In contrast with the first embodiment, the duty-to-voltage amplifier 6 further comprises a second current source 601 and a second switch 603. The second current source 601 is configured to generate a second current 602, wherein the current source 301 is herein renamed as a first current source 301 and the current 302 is herein renamed as a first current 302 for the purpose of distinguishing. The second switch 603, comprising a pair of complementary switches 603A and 603B, is configured to control a flow of the second current 602 in response to a second PWM signal 604. The switch 303 is herein renamed as a first switch 303 and the PWM signal 304 is herein renamed as a first PWM signal 304 for the purpose of distinguishing. The current splitter 305 splits the flow of the first current 302 and the flow of the second current 602 to generate the sub-flow.

Figure 7:
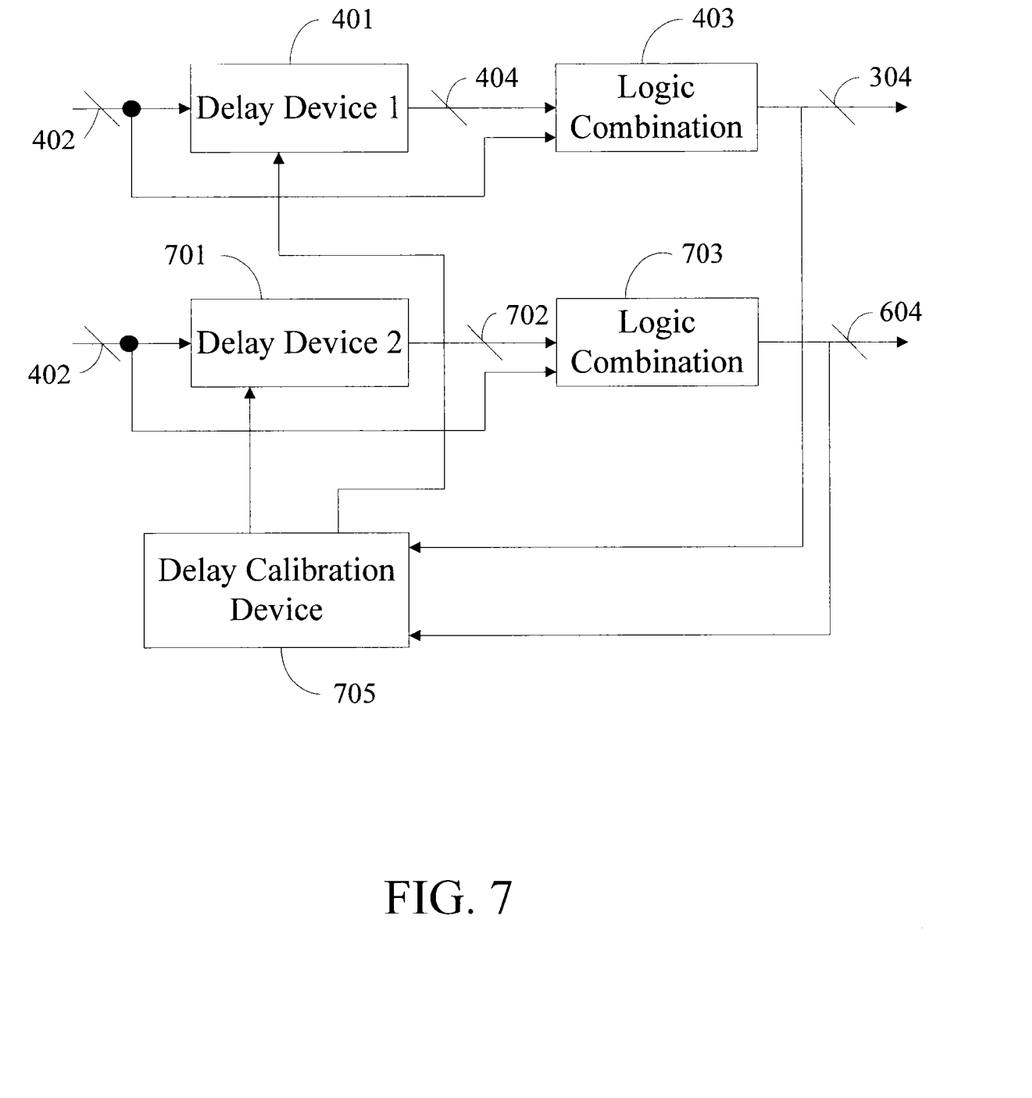
FIG. 7 is a block diagram of a delay circuit of the second embodiment.
Figure 8:
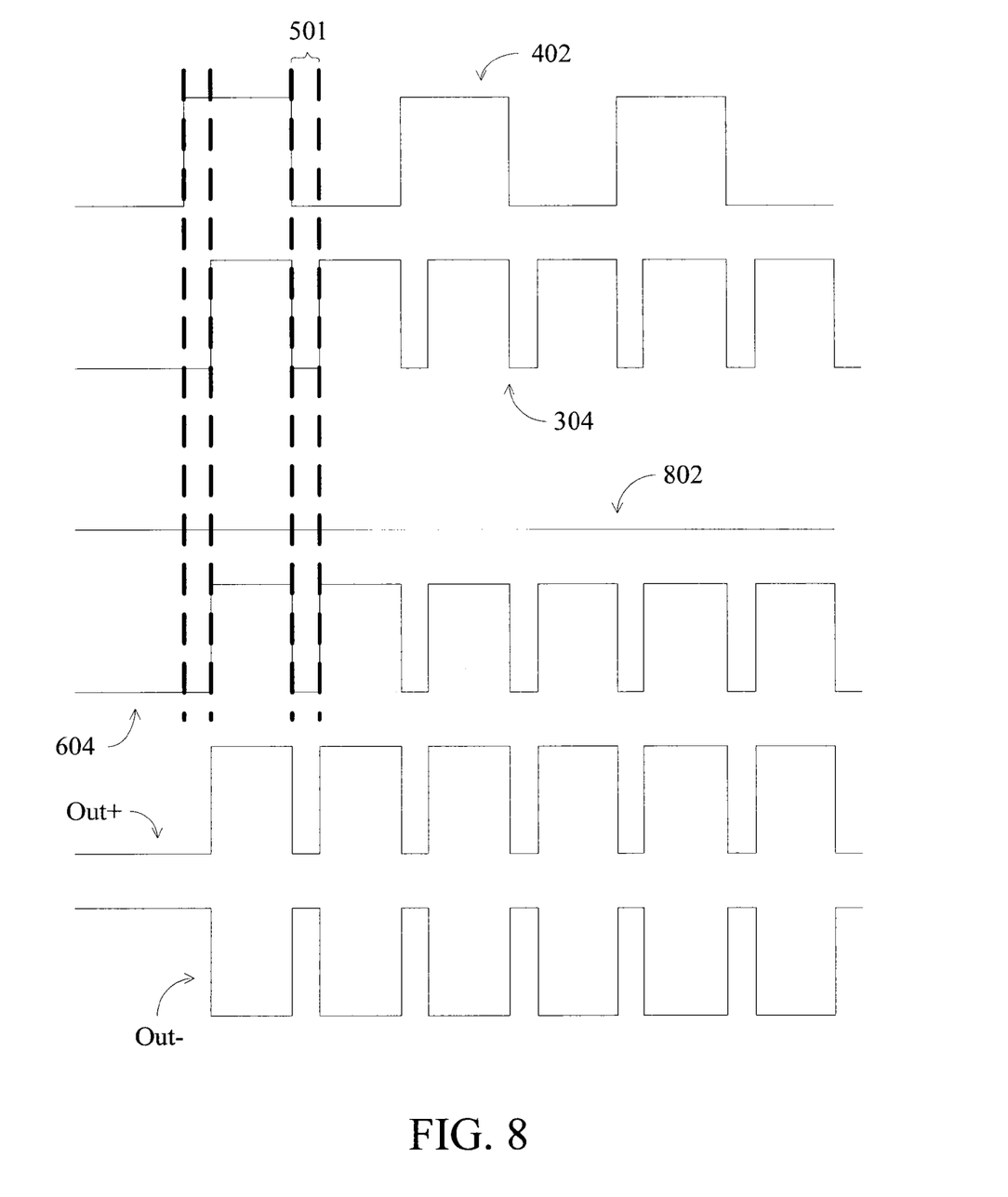
FIG. 8 is some waveforms for illustrating operations of the second embodiment.

The delay circuit of the duty-to-voltage amplifier 6 is shown in FIG. 7. In contrast with the delay circuit of the first embodiment, the second embodiment further comprises a delay device 701, a logic combination device 703, and a delay calibration device 705. The delay device 701 delays the FM modulated signal 402 to generate a delayed signal 702. The logic combination device 703 logically combines the delayed signal 702 and the FM modulated signal 402 to generate the second PWM signal 604. In the second embodiment, as shown in FIG. 8, the second PWM signal 604 is generated by performing an exclusive-OR function on the first PWM signals 304 and a ground signal 802. The delay calibration device 705 is configured to retrieve the first PWM signal 304 and the second PWM signal 604 to calibrate the interval 501.

Figure 9:
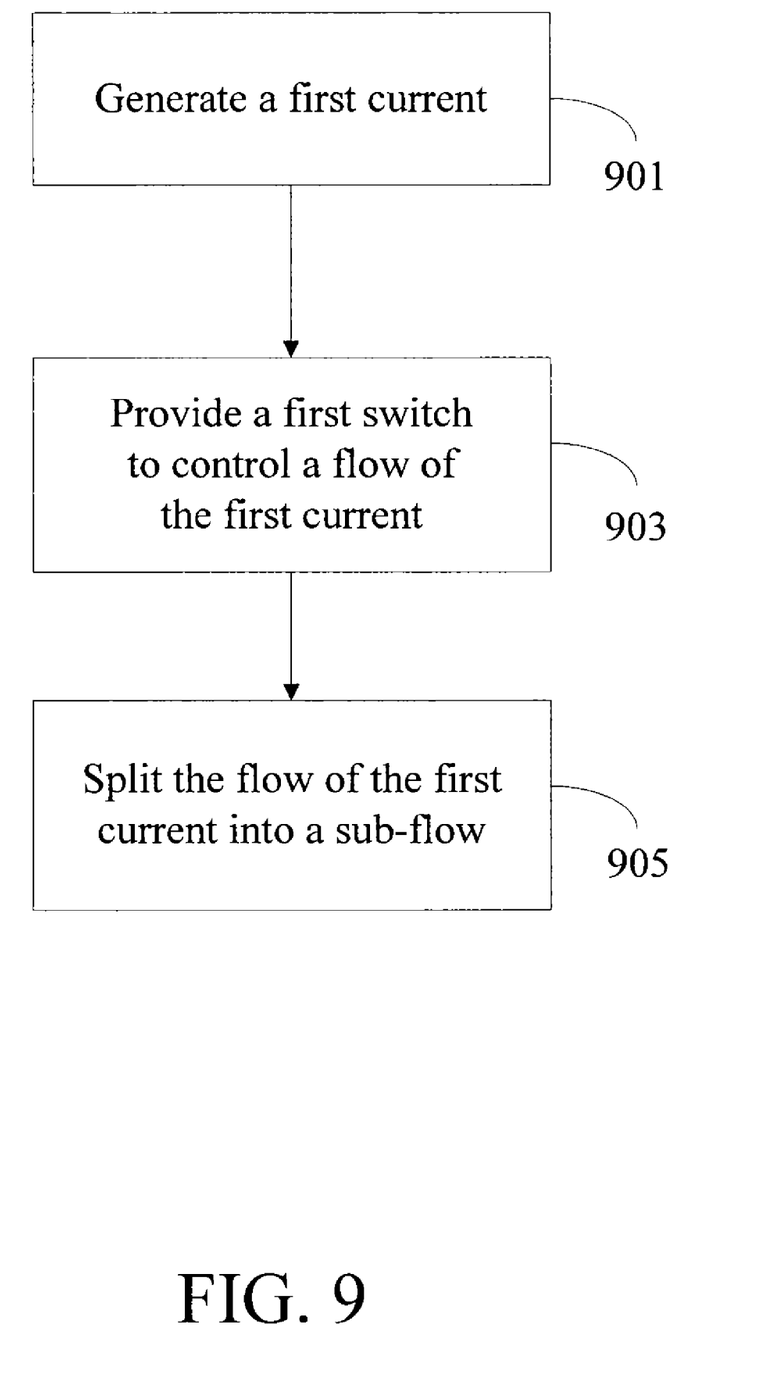
FIG. 9 is a flow chart of a third embodiment of the present invention.

A third embodiment of the present invention is a method for a duty-to-voltage amplifier to amplify a peak of a MPX signal. The duty-to-voltage amplifier may be the first embodiment or the second embodiment. As shown in FIG. 9, the third embodiment comprises the following steps. In step 901, a first current source of the duty-to-voltage amplifier generates a first current. In step 903, the duty-to-voltage amplifier provides a first switch to control a flow of the first current in response to a first PWM signal. In step 905, a splitter of the duty-to-voltage amplifier splits the flow of the first current into a sub-flow in response to an RSSI, wherein the peak is proportional to the sub-flow.

Figure 10:
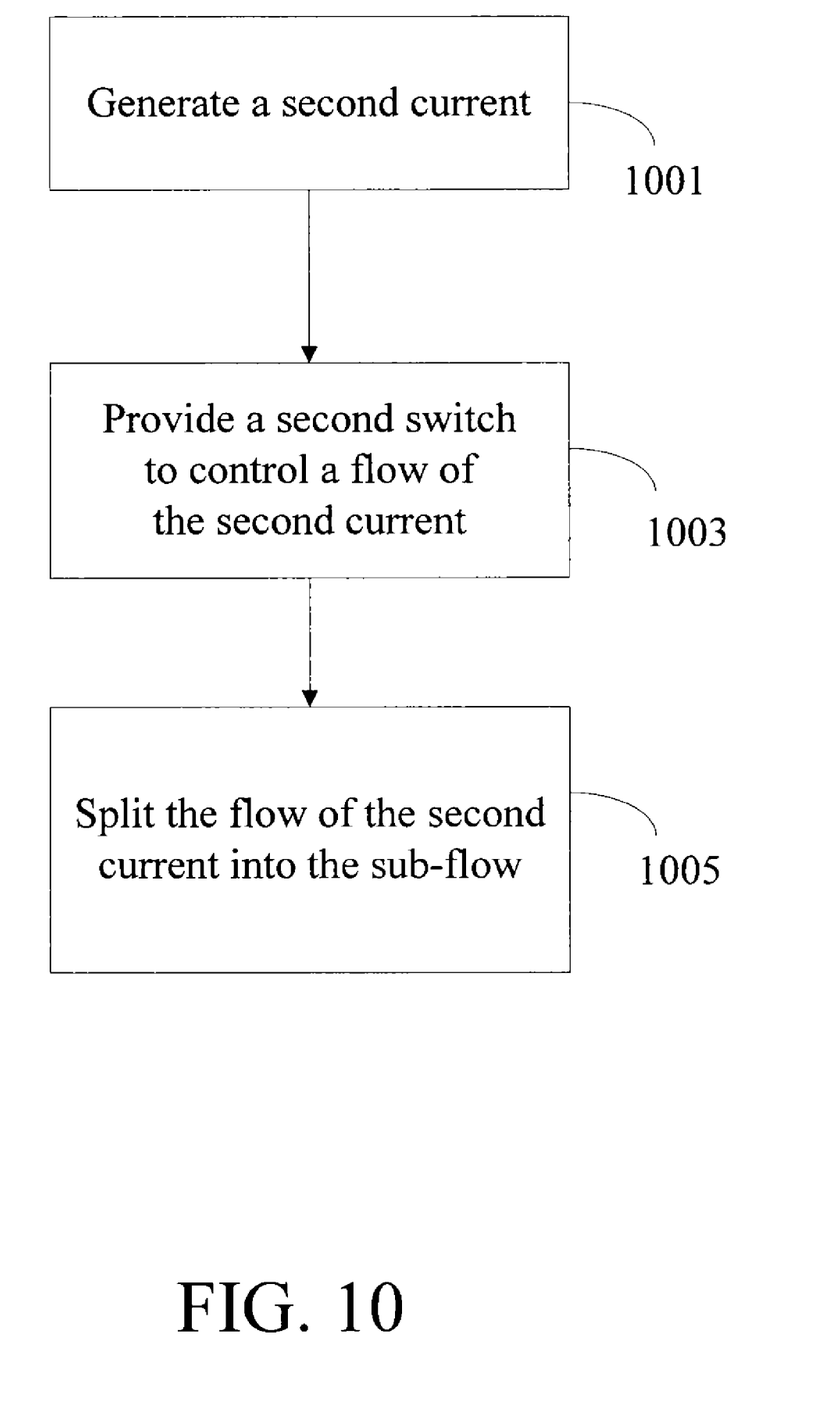
FIG. 10 is another flow chart of the third embodiment.

As shown in FIG. 10, the third embodiment further comprises the following steps. In step 1001, a second current source of the duty-to-voltage amplifier generates a second current. In step 1003, the duty-to-voltage amplifier provides a second switch to control a flow of the second current in response to a second PWM signal. In step 1005, a current splitter of the duty-to-voltage amplifier splits the flow of the second current into the sub-flow in response to an RSSI. Therefore, the sub-flow is formed from the first current and the second current or a part of them.

The third embodiment further comprises a step of an amplifier comparing the RSSI with a threshold voltage to generate a differential signal, and a step of the duty-to-voltage amplifier generating a reference signal. The current splitter receives the differential signal and the reference signal to split the flow of the first current and the flow of the second current. Besides, the third embodiment further comprises a step of the duty-to-voltage amplifier providing a load to generate the sub-flow.

The third embodiment may perform all of the operations or steps recited in the first embodiment and the second embodiment.

Figure 11:
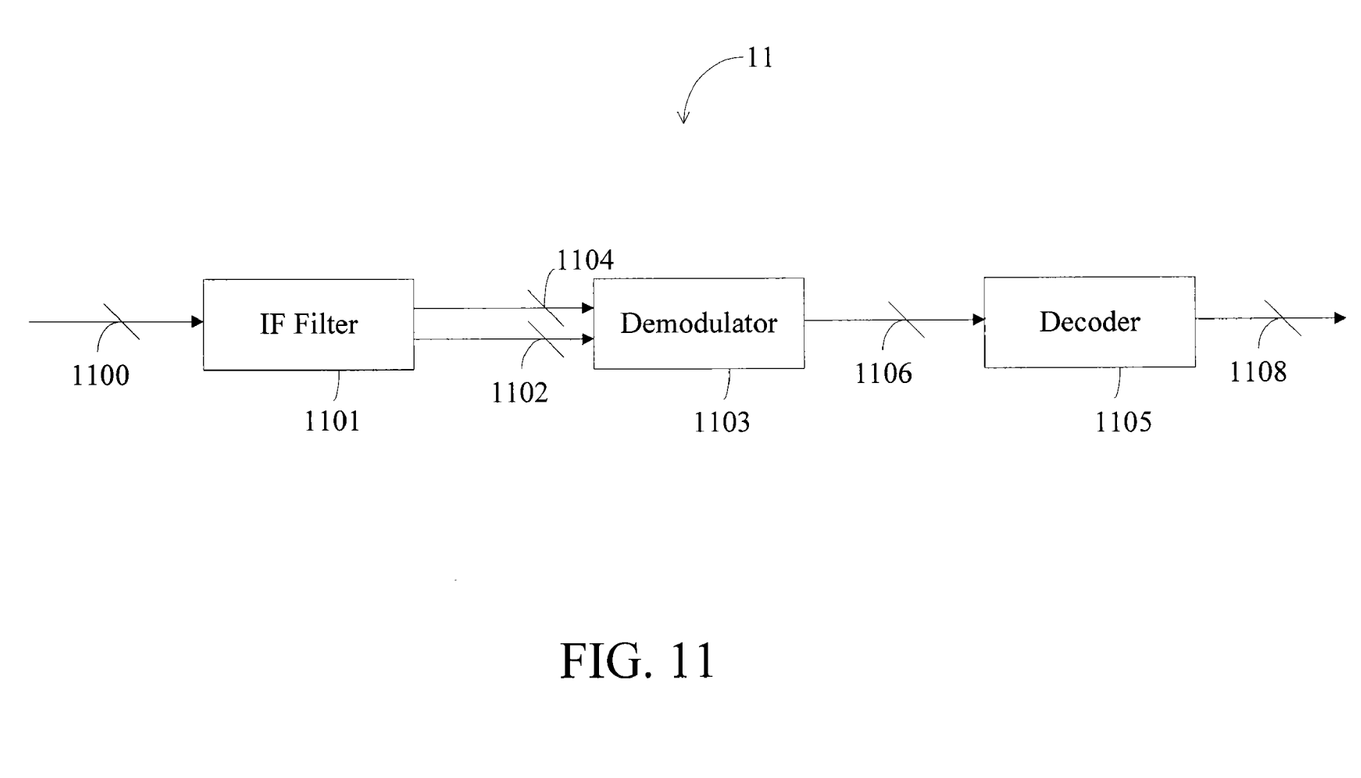
FIG. 11 is a block diagram of a fourth embodiment of the present invention.

A fourth embodiment of the present invention is a FM receiver 11 as shown in FIG. 11. The FM receiver 11 comprises an IF filter 1101, a demodulator 1103 and a decoder 1105. The IF filter 1101 is configured to receive a FM signal 1100 and generate an RSSI 1102 and a FM modulated signal 1104 in response to the FM signal 1100. The demodulator 1103 is configured to generate a MPX signal 1106 in response to the FM modulated signal 1104 and amplify a peak of the MPX signal 1106 in response to the RSSI 1102. In particular, the demodulator 1103 comprises a duty-to-voltage amplifier similar to the first embodiment or the second embodiment. The decoder 1105 is configured to receive the MPX signal 1106 and generate an audio signal 1108 in response to the peak of the MPX signal 1106. The audio signal 1108 is then transmitted to a loudspeaker to play sound.

Because information of playing sound is carried in the widths of square waves of the FM modulated signal, the present invention is able to reduce distortion when a soft-mute operation is triggered since the present invention generate a MPX signal directly in response to an RSSI and a threshold but not adjust a peak of the MPX signal after the MPX signal is generated.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A FM receiver, comprising:
   an intermediate frequency (IF) filter for generating an RSSI and a FM modulated signal in response to a FM signal;
   a demodulator for generating a MPX signal in response to the FM modulated signal and for amplifying a peak of the MPX signal in response to the RSSI, the demodulator, including:
      a first current source for generating a first current;
      a first switch responsive to a first PWM signal for controlling a flow of the first current;
      a current splitter for splitting the flow of the first current into a sub-flow in response to the RSSI, wherein the peak is proportional to the sub-flow; and
   a decoder for receiving the MPX signal and generating an audio signal in response to the peak.

2. The FM receiver as claimed in claim 1, the demodulator further comprising:
   a second current source for generating a second current; and
   a second switch, responsive to a second PWM signal, for controlling a flow of the second current;
   wherein the current splitter splits the flow of the second current into the sub-flow in response to the RSSI.

3. The FM receiver as claimed in claim 1, the demodulator further comprising an amplifier for outputting a differential signal by comparing the RSSI with a threshold voltage, wherein the current splitter splits the flow of the first current in response to the differential signal.

4. The FM receiver as claimed in claim 1, wherein the demodulator generates a reference signal, and the current splitter splits the flow of the first current in response to the reference signal.

5. The FM receiver as claimed in claim 1, wherein the demodulator further comprises a load to generate the sub-flow.

6. A FM receiver, comprising:
   filter means for generating an RSSI and a FM modulated signal in response to a FM signal;
   demodulator means for generating a MPX signal in response to the FM modulated signal and for amplifying a peak of the MPX signal in response to the RSSI, the demodulator means including:
      means for generating a first current;
      means for controlling a flow of the first current in response to a first PWM signal;
      means for splitting the flow of the first current into a sub-flow in response to the RSSI, wherein the peak is proportional to the sub-flow; and
   decoder means for receiving the MPX signal and generating an audio signal in response to the peak.

7. The FM receiver of claim 6, wherein the demodulator means further comprises:
   means for generating a second current; and
   means for controlling a flow of the second current in response to a second PWM signal;
   wherein the splitting means splits the flow of the second current into the sub-flow in response to the RSSI.

8. The FM receiver of claim 6, wherein the demodulator means further comprises:
   means for outputting a differential signal by comparing the RSSI with a threshold voltage, wherein the splitting means receives the differential signal to split the flow of the first current.

9. The FM receiver of claim 6, wherein the demodulator means further comprises: means for generating a reference signal, wherein the splitting means splits the flow of the first current in response to the reference signal.

10. The FM receiver of claim 6, further comprising:
a load to generate the sub-flow.

11. A method of operating an FM receiver, comprising:
receiving an FM signal
generating an RSSI and an FM modulated signal in response to the FM signal;
generating a MPX signal in response to the FM modulated signal and amplifying a peak of the MPX signal in response to the RSSI, wherein amplifying the peak of the MPX signal in response to the RSSI, includes:
receiving the MPX signal and generating an audio signal in response to the peak;
generating a first current;
providing a first switch to control a flow of the first current in response to a first PWM signal; and
splitting the flow of the first current into a sub-flow in response to the RSSI;
wherein the peak is proportional to the sub-flow.

12. The method of claim 11, further comprising:
generating a second current;
providing a second switch to control a flow of the second current in response to a second PWM signal; and
splitting the flow of the second current into the sub-flow in response to the RSSI.

13. The method of claim 11, further comprising:
comparing the RSSI with a threshold voltage to generate a differential signal;
wherein the splitting step splits the flow of the first current in response to the differential signal.

14. The method of claim 11, further comprising:
generating a reference signal;
wherein the splitting step splits the flow of the first current in response to the reference signal.

15. The method of claim 11, further comprising:
providing a load to generate the sub-flow.

* * * * *